US012699815B2

(12) United States Patent
Reichl

(10) Patent No.: US 12,699,815 B2
(45) Date of Patent: *\*Aug. 4, 2026**

(54) SYSTEMS AND METHODS FOR INSTALLING AND WIRING BUILDING EQUIPMENT

(71) Applicant: Tyco Fire & Security GmbH, Neuhausen am Rheinfall (CH)

(72) Inventor: Gregory T. Reichl, Kaukauna, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/243,517

(22) Filed: Sep. 7, 2023

(65) Prior Publication Data

US 2024/0070343 A1 Feb. 29, 2024

Related U.S. Application Data

(63) Continuation of application No. 16/244,717, filed on Jan. 10, 2019, now Pat. No. 11,768,977.

(51) Int. Cl.
*G06F 30/18* (2020.01)
*G05B 15/02* (2006.01)
*G06F 3/048* (2013.01)

(52) U.S. Cl.
CPC .............. *G06F 30/18* (2020.01); *G05B 15/02* (2013.01); *G06F 3/048* (2013.01)

(58) Field of Classification Search
CPC ............ G05B 15/02; G05B 2219/2642; G05B 2219/25471; G05B 2219/2614;
(Continued)

(56) References Cited

U.S. PATENT DOCUMENTS 6,606,731 B1 8/2003 Baum et al.
2003/0025734 A1 2/2003 Boose et al.
(Continued)

OTHER PUBLICATIONS

Siemens Technical Instructions, "Open Air/GBB/GIB Series Electronic Damper Actuators," Document No. 155-177P25, published Jun. 22, 2015 (Year: 2015).*
(Continued)

*Primary Examiner* — Eric J Yoon
(74) *Attorney, Agent, or Firm* — Foley & Lardner LLP

(57) ABSTRACT

Systems and methods for guided installation of building equipment are provided. A request for a wiring diagram for wiring a first piece of building equipment to a second piece of building equipment is received from a user device. One or more first wiring configurations associated with the first piece of building equipment and one or more second wiring configurations associated with the second piece of building equipment are identified. Based on the one or more first wiring configurations and the one or more second wiring configurations, an equipment-specific wiring configuration for wiring the first piece of building equipment to the second piece of building equipment is automatically selected. A graphical user interface including a wiring diagram illustrating the equipment-specific wiring configuration is provided to the user device.

19 Claims, 8 Drawing Sheets

(58) Field of Classification Search
CPC .......... G06F 30/12; G06F 30/13; G06F 30/30;
F24F 11/50; F24F 11/89; G06N 5/04
See application file for complete search history.

(56) References Cited

U.S. PATENT DOCUMENTS

| | | | |
|---|---|---|---|
| 2009/0062964 A1 | 3/2009 | Sullivan et al. | |
| 2010/0076605 A1 | 3/2010 | Harrod et al. | |
| 2014/0048608 A1 | 2/2014 | Frank | |
| 2014/0350733 A1* | 11/2014 | Lorenz | F24F 11/58 |
| | | | 700/276 |
| 2015/0144705 A1 | 5/2015 | Thiruvengada et al. | |
| 2015/0159895 A1* | 6/2015 | Quam | G08B 5/36 |
| | | | 700/275 |
| 2015/0332150 A1 | 11/2015 | Thompson | |
| 2016/0344877 A1* | 11/2016 | Altamirano | H04N 1/00493 |
| 2017/0053441 A1 | 2/2017 | Nadumane et al. | |
| 2017/0244597 A1* | 8/2017 | Coote | H04L 69/18 |
| 2018/0283716 A1* | 10/2018 | Ribbich | G05B 15/02 |

OTHER PUBLICATIONS

Garage Journal website, "Thermostat Wiring R&W Only" thread, dated Dec. 30, 2018, downloaded from https://www.garagejournal.com/forum/threads/thermostat-wiring-r-w-only.411021/ (Year: 2018).*

Jenkins S., "How to install an ecobee smart thermostat," web page from website stevejenkins.com, downloaded from https://www.stevejenkins.com/blog/2014/09/how-to-install-an-ecobee3-smart-thermostat/), dated Oct. 19, 2014 by waybackmachine.org ( Year: 2014).*

Markowitz, Quora website page, "In database, what are lookup tables?," downloaded from https://www.quora.com/In-database-what-are-lookup-tables, 2017 (6 pages).

* cited by examiner

500

700

800

SYSTEMS AND METHODS FOR INSTALLING AND WIRING BUILDING EQUIPMENT

CROSS-REFERENCE TO RELATED APPLICATION

This application is a continuation of U.S. patent application Ser. No. 16/244,717, filed Jan. 10, 2019, the entire disclosure of which is incorporated by reference herein.

BACKGROUND

The present disclosure relates generally to installing and wiring building equipment. The present disclosure relates more particularly to systems and methods for automatically generating and presenting wiring diagrams to a user for use in installing and wiring building equipment such as controllers and controllable equipment. The present disclosure relates more particularly still to providing a graphical user interface that a user can see and use when installing and wiring building equipment.

Equipment installation personnel often need to install equipment in buildings to control different aspects of the building. Examples of controllable equipment in a building are sensors, valves, fans, lighting, and any other device that makes the building inhabitable. To control these devices, controllers are often installed and wired to the controllable equipment so the devices can be more easily controlled. Installing the controllers and the controllable equipment is often complex so building owners call experienced installers to make sure the installation is done correctly. Even experienced installers use diagrams and data sheets to determine how to wire the controllers to the devices.

Typically, multiple wiring diagrams are needed to understand how to install a specific controller to a specific device (e.g., one wiring diagram for the controller and another wiring diagram for the device). These diagrams are often generic representations of the wiring to common language which is not typically learned by the installer until after multiple years of training. For example, there may be multiple symbols in a wiring diagram that a first time installer may not understand. To add to this problem, the wiring diagram may not pertain to the exact devices being installed, and instead pertain just to a generic version of the device, meaning the first time installer would need to both decipher the generic language wiring diagram and adjust for any differences between the specific model of the device and the specific model shown in the diagram. It would be desirable to provide wiring instructions that overcome these and other disadvantages.

SUMMARY

One implementation of the present disclosure is a method for guided installation of building equipment. The method comprises receiving, from a user device, a request for a wiring diagram for wiring a first piece of building equipment to a second piece of building equipment and identifying one or more first wiring configurations associated with the first piece of building equipment and one or more second wiring configurations associated with the second piece of building equipment. The method also comprises automatically selecting, based on the one or more first wiring configurations and the one or more second wiring configurations, an equipment-specific wiring configuration for wiring the first piece of building equipment to the second piece of building equipment and providing a graphical user interface to the user device, the graphical user interface comprising a wiring diagram illustrating the equipment-specific wiring configuration.

In some embodiments, the first piece of building equipment is a controller and the second piece of building equipment is a field device.

In some embodiments, the request comprises a first equipment identifier identifying the first piece of building equipment and a second equipment identifier identifying the second piece of building equipment.

In some embodiments, the method further comprises obtaining the first equipment identifier from the first piece of building equipment and obtaining the second equipment identifier from the second piece of building equipment. The first and second equipment identifiers comprising at least one of an RFID code, a UPC code, a CPC binary bar code, a POSTNET, or a QR code.

In some embodiments, the method further comprises receiving a second request from the user device for new wiring configurations associated with the two pieces of building equipment based on an input from a user and configuring a new graphical user interface based on the new wiring configurations.

In some embodiments, the method further comprises sending all wiring configurations associated with the two pieces of building equipment, regardless of the request from the user device, after receiving the request from the user device.

In some embodiments, the method further comprises tagging each of the one or more first wiring configurations with an identifier of the first piece of building equipment and tagging each of the one or more second wiring configurations with an identifier of the second piece of building equipment.

In some embodiments, automatically selecting the equipment-specific wiring configuration comprises selecting a wiring configuration tagged with both the identifier of the first piece of building equipment and the identifier of the second piece of building equipment.

In some embodiment, identifying the wiring configurations comprises identifying, from a database comprising controller diagrams and a database comprising field device data, one or more wiring configurations that have been tagged with an identifier representing the first piece of building equipment and one or more wiring configurations that have been tagged with an identifier representing the second piece of building equipment.

In some embodiments, the method further comprises displaying, via the user device, a user interface that prompts a user to select a first wiring connection on the first piece of building equipment to wire to a second wiring connection on the second piece of building equipment. Automatically selecting the equipment-specific wiring configuration comprises selecting a wiring configuration in which the first wiring connection on the first piece of building equipment is wired to the second wiring connection on the second piece of building equipment.

Another implementation is an installation management system for building equipment. The installation management system comprises one or more processors communicatively coupled to one or more memory devices, said installation management system is configured to receive, from a user device, a request for a wiring diagram for wiring a first piece of building equipment to a second piece of building equipment and identify one or more first wiring configurations associated with the first piece of building equipment and one or more second wiring configurations associated with the second piece of building equipment. The installation management system is also configured to automatically select, based on the one or more first wiring configurations and the one or more second wiring configurations, an equipment-specific wiring configuration for wiring the first piece of building equipment to the second piece of building equipment and provide a graphical user interface to the user device, the graphical user interface comprising a wiring diagram illustrating the equipment-specific wiring configuration.

In some embodiments, the first piece of building equipment is a controller and the second piece of building equipment is a field device.

In some embodiments, the request comprises a first equipment identifier identifying the first piece of building equipment and a second equipment identifier identifying the second piece of building equipment.

In some embodiments, the installation management system is further configured to obtain the first equipment identifier from the first piece of building equipment and obtain the second equipment identifier from the second piece of building equipment, the first and second equipment identifiers comprising at least one of an RFID code, a UPC code, a CPC binary bar code, a POSTNET, or a QR code.

The installation management system of claim 11, wherein the installation management system is further configured to receive a second request from the user device for new wiring configurations associated with the two pieces of building equipment based on an input from a user and configuring a new graphical user interface based on the new wiring configurations.

The installation management system of claim 11, wherein the installation management computer system is further configured to tag each of the one or more first wiring configurations with an identifier of the first piece of building equipment and tag each of the one or more second wiring configurations with an identifier of the second piece of building equipment.

Another implementation is a non-transitory computer-readable storage medium having computer-executable instructions embodied thereon, wherein when executed by at least one processor. The computer-executable instructions cause the at least one processor to receive, from a user device, a request for a wiring diagram for wiring a first piece of building equipment to a second piece of building equipment and identify one or more first wiring configurations associated with the first piece of building equipment and one or more second wiring configurations associated with the second piece of building equipment. The computer-executable instructions automatically select, based on the one or more first wiring configurations and the one or more second wiring configurations, an equipment-specific wiring configuration for wiring the first piece of building equipment to the second piece of building equipment and provide a graphical user interface to the user device, the graphical user interface comprising a wiring diagram illustrating the equipment-specific wiring configuration.

In some embodiments, the first piece of building equipment is a controller and the second piece of building equipment is a field device.

In some embodiments, the computer-executable instructions further cause the processor to obtain the first equipment identifier from the first piece of building equipment and obtain the second equipment identifier from the second piece of building equipment. The first and second equipment identifiers comprise at least one of an RFID code, a UPC code, a CPC binary bar code, a POSTNET, or a QR code.

In some embodiments, the computer-executable instructions further cause the processor to tag each of the one or more first wiring configurations with an identifier of the first piece of building equipment and tag each of the one or more second wiring configurations with an identifier of the second piece of building equipment.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Overview

Figure 1:
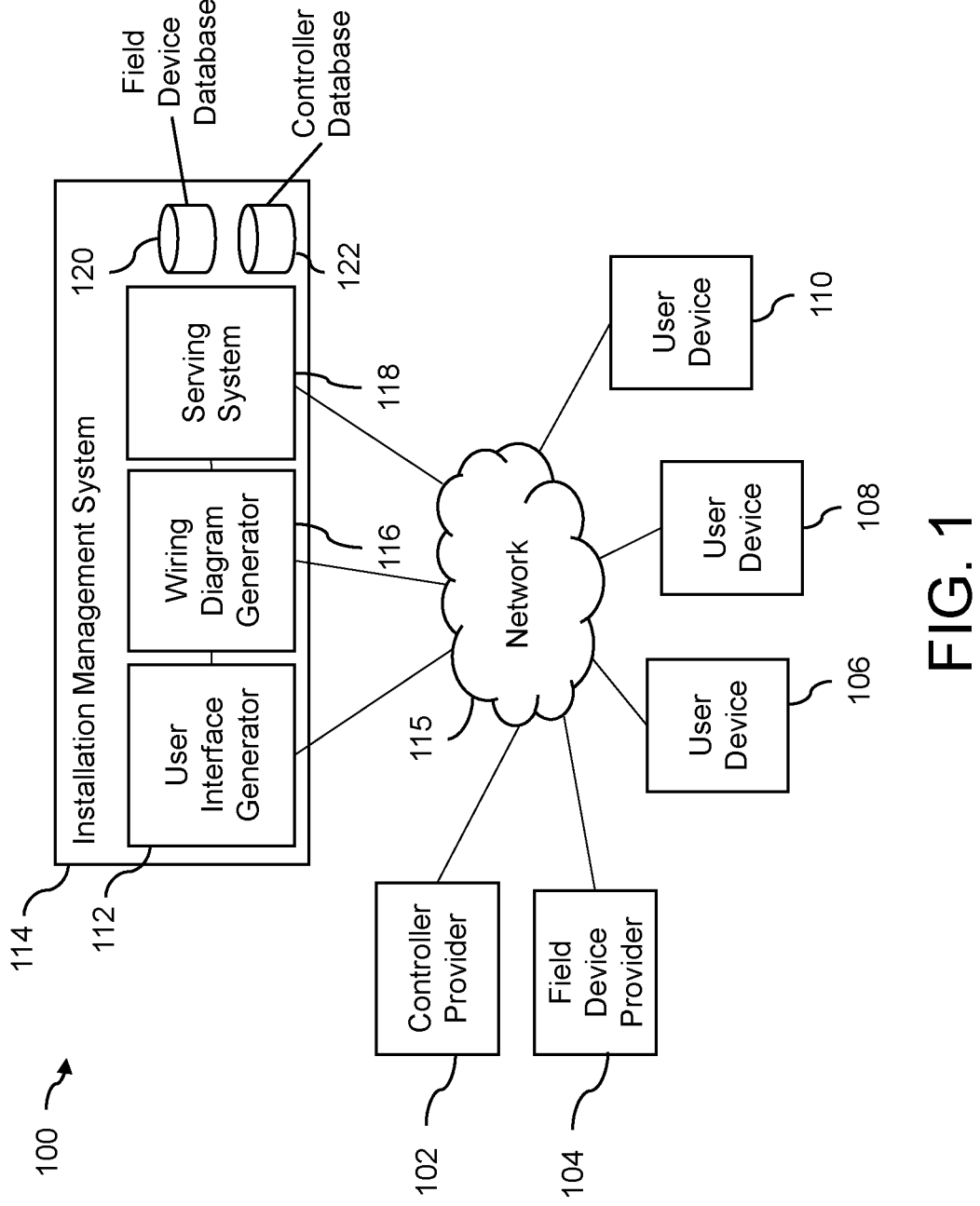
FIG. 1 is a block diagram depicting an example installation environment for configuring and displaying wiring diagrams for building equipment, according to some embodiments.

Referring generally to the figures, a system and method for automatically generating and presenting wiring instructions for building equipment are shown, according to various exemplary embodiments. An installation management system may be able to receive, store, and create interactive graphical user interfaces including wiring diagrams for building equipment and data associated with the building equipment. The building equipment may be a controller or other types of devices configured to operate buildings. In some embodiments, the installation management system creates the graphical user interface in response to receiving a request from a user device. The request may ask for a wiring diagram and/or data associated with building equipment. The wiring diagram and the data may be shown in combination to provide instructions at the user device showing how to wire two or more pieces of building equipment.

The installation management system may include a serving system. The serving system may be able to receive and process building equipment information (e.g., wiring diagrams, configuration information, etc.) received from controller providers and field device providers and store the information in a database. The serving system may be able to configure controller information before storing the information in a controller database so the controller information and the data associated with it is easily accessible when being retrieved. The serving system may also store information associated with field devices in a field device database.

The installation management system may also include a wiring diagram generator that can interact with user devices through a serving system to respond to requests sent from the user devices when users interact with a graphical user interface on the user device. The wiring diagram generator may be able to retrieve controller information from the controller database and data associated with field devices from a field device database. The wiring diagram generator may then automatically generate a graphical wiring diagram showing each piece of building equipment wired together and send the graphical wiring diagram to a user interface generator.

The wiring diagram generator may automatically generate a graphical wiring diagram by generating a list of possible wiring configurations for each piece of building equipment. Each list can have one or more wiring configurations. The wiring diagram generator can then match the wiring configurations of each piece of building equipment together to form a list of possible wiring configurations and generate a graphical wiring diagram based on the list. After the graphical wiring diagram is generated, the wiring diagram generator can send it to the user interface generator.

A user interface generator may be included in the installation management system. The user interface generator may be configured to create a user interactive graphical user interface including the graphical wiring diagram it receives from the wiring diagram generator. After generating a graphical user interface with this data, the user interface generator may be able to send the graphical user interface to the user device. Users may be able to press on the graphical user interface to ask for different information in the graphical user interface, at which point the user interface generator may receive a new graphical wiring diagram from the wiring diagram generator, generate a new user interface with the graphical wiring diagram, and send the new user interface to the user that made the request.

To generate a request for a graphical user interface, a user may use a user device to input two specific types of building equipment to the installation management system. The request may include an identifier describing a type of building equipment. In some embodiments the user may input the controller and building equipment by manually typing in product codes associated with the device, scanning an RFID code, a UPC code, a CPC binary bar code, a POSTNET, a QR code, etc. The user may input one or a plurality of pieces of building equipment to obtain information about each piece of building equipment and how to wire them together.

In an example of the installation management system generating a wiring diagram between two pieces of building equipment, a user may scan an RFID code for a standard controller and an RFID code for an actuator. The user may then send a request through a user device to the installation management system asking the installation management system for information about how to wire the controller to the actuator. The installation management system may search the databases and generate a graphical user interface to send back to the user device showing options for how the actuator and controller should be wired. The user may be able to input a configuration selection and send a request back to the user interface generator asking for more specific information about the desired wiring configuration. The installation management system may receive the request, retrieve the associated data, and then send a graphical user interface showing the desired wiring configuration. In some embodiments, the user can press on a component within the graphical user interface to adjust the wiring configuration to change how the actuator operates, such as rotating clockwise instead of counter clockwise. The request may be sent to the installation management system, which again may retrieve the data from the databases and send back a graphical user interface with the data pertaining to a new wiring configuration.

Advantageously, the systems and methods described herein may be able to help speed up installation and make the installation process easier by identifying a specific controller and a field device, or other specific components and providing device-specific wiring diagrams for the identified devices. Thus, a more descriptive wiring diagram and installation information may be obtained. Through the use of product tagging, such as UPC, QR codes, RFID, etc., each product could be uniquely identified and the device identity information could be provided via a device, e.g. mobile phone, tablet, etc. A person installing a controller to the field device may be able to easily determine how to install the specific controller with the specific device on hand instead of guessing how to wire the field device to the controller based on specialized symbols and generalized wiring diagrams. Further, the data associated with the field device may be integrated with the controller information so an installer may be able to easily see how to install the controller with the field device. In some embodiments, if the installer needs to know how to change the operation of field device or needs to change the device configuration, the present disclosure provides an easy method of doing so.

It is understood that the installation management system may be readily implemented in various types of controllers (e.g., motor controllers, power controllers, fluid controllers, HVAC controllers, lighting controllers, chemical controllers, process controllers, etc.) and various types of control systems (e.g., closed-loop control systems, open-loop control systems, feedback control systems, feed-forward control systems, etc.) as may be suitable for various applications. All such implementations should be considered within the scope of the present disclosure. It is also understood that the invention is not limited to the details or methodology set forth in the description or illustrated in the figures. The terminology used in the present disclosure is for the purpose of description only and should not be regarded as limiting.

Installation Environment

Referring now to FIG. 1, a diagram depicting an installation environment 100 for generating and displaying instruction diagrams with field devices is shown, according to some embodiments. Installation environment 100 is shown to include a controller provider 102, a field device provider 104, user devices 106, 108, and 110, and an installation management system 114 all connected to each other via a network 115. Each of the components 102, 104, 106, 108, 110, and 114 may be implemented or associated with hardware, software, or firmware, or any combination thereof. For example, elements 102, 104, 106, 108, 110, and 114 may be implemented using servers, software processes, and/or embedded systems. User devices 106, 108, and 110 are used by end users, such as installers, as described below.

In brief overview, a controller provider 102 and a field device provider 104 may provide device information (e.g., configuration information, wiring diagrams, device specifications, etc.) for various types of controllers and field devices. The device information may be stored in a field device database 120 and a controller database 122 and can be accessed by installation management system 114. A user wishing to wire two or more pieces of building equipment together may provide a request for installation instructions to installation management system 114 via one or more of user devices 106-110. The request may include device identifying information (e.g., device model numbers, an image of the pieces of building equipment, an image of an RFID code, a UPC code, a CPC binary bar code, a POST-NET, or a QR code on the pieces of building equipment, etc.) that allows installation management system 114 to identify the two or more pieces of building equipment that the user wishes to wire together. Installation management system 114 may automatically identify the pieces of building equipment and retrieve the corresponding device information from field device database 120 and/or controller database 122. Installation management system 114 may use the device-specific information to automatically generate a wiring diagram that is specific to the identified pieces of building equipment. Installation management system 114 may provide the wiring diagram to user devices 106-110 as part of a graphical user interface. The user may be able to then use the device-specific wiring diagram to wire the two or more pieces of building equipment together.

Controller provider 102 may include any entity that generates and uploads different controller information, which may include, but is not limited to, wiring diagrams, configuration information, device specifications, installation instructions, and other information related to controllers, onto network 115. The entity could be, but is not limited to, a controller designer, manufacturer, distributor, installer, or another entity that creates provides, or maintains information associated with various types of controllers. Controller provider 102 may design different types of controllers, such as, but not limited to proportional controllers, derivative controllers, integral controllers, PID controllers, and any other type of controller. Controller information may be described with pictures, words, sounds, or any combination thereof.

Controller database 122 may be a dynamic database including controller information, wiring diagrams, and other data associated with controllers uploaded to network 115 by controller provider 102. Controller database 122 may hold any amount of controller information and wiring diagrams. Controller database 122 may be organized into sections. Each section represents a different type of building equipment. The sections may then be further broken down into subsections, wherein each subsection can represent specific types of the field devices or specific models of the field devices. Wiring diagrams for specific models of the field device may be included in the subsection for specific types of field devices. Wiring diagrams may be added to controller database 122 by controller provider 102 at any time.

Different types of controllers that controller database 210 has information about and that are included in controller database list 211 include, but are not limited to, Metasys, FX PEAK, Simplex, and C-Cure. Different types of inputs that are included in controller database list 211 include, but are not limited to, analog, binary, and universal. Different types of outputs that are included in controller database list 211 include, but are not limited to, analog, binary, and configurable. These sections within controller database 210 are dynamic, so sections may be added, sections may be removed, information may be added, and information may be removed.

Wiring diagrams may be removed by a user that attaches a machine to network 115 and manually removes wiring diagrams from controller database 122 that are obsolete, incorrect, or no longer useful. The user may remove wiring diagrams for any other reason. Another method of removing wiring diagrams from controller database 122 is setting up an automatic removal system, where any wiring diagrams that have been in controller database for X years are automatically removed. X may be able to be any number of years, including a portion of a year. There are no limitations to the amount of wiring diagrams controller database 122 may hold or remove.

Field device provider 104 may include any entity that generates and uploads data associated with one or a plurality of field devices onto network 115. Similar to controller provider 102, field device provider 104 may include any sort of entity. The entity could be, but is not limited to, a field device designer, manufacturer, distributor, installer, or another entity that creates provides, or maintains information associated with various types of controllers. The data that field device provider 104 uploads to network 115 may describe field devices, how the field devices operate, and how to wire controllers to the field devices. Examples of types of field devices may include, but are not limited to, actuators, pumps, fans, chillers, heaters, valves, air handling units, dampers, sensors, controllers, manufacturing devices, or any other type of field device that may be able to be used to monitor and/or control a building. The types may go into further subtypes for different models of each type of field devices.

The data provided by field device provider 104 may include detailed drawings of the field devices that show inputs where wires may be inserted into the field device and different functions that are associated with each input. For example, if an actuator is the field device, three inputs could be shown where wires could be inserted. Each input may have a designation for the wires labelling one input as positive, one input as negative, and one input as neutral. If wires giving power are fed into the inputs, wherein the positive power wire is fed into the negative input and the negative wire is fed into the positive input, a rotor in the actuator could rotate clockwise. However, if the wires are placed into the actuator in reverse, the rotor could turn counter clockwise. These designations in the actuator could be arranged in any manner. Field device provider 104 may upload the inputs and all information about the inputs as data onto network 115. Other examples of data associated with one or a plurality of field device may include attributes describing how the field device operates, similar devices, descriptions of how to connect wires to the respective field device, warning signals, or any other information that could be associated with the building equipment.

Field device provider 104 may also generate and upload schematics for field devices to network 115. Schematics may be drawings that depict field devices as separate components, descriptions of those components, and descriptions of how to connect the components together to create the field device. Schematics may generally be used by installers when the installers are building a field device, such as a heater, in a space. The installers may look at the schematics and build the field devices based on the drawings and descriptions in the schematics.

Field device database 120 may be a dynamic database that includes data associated with different field devices provided by field device providers 104, such as wiring diagrams. When field device provider 104 uploads data concerning devices to network 115, the data may be stored in field device database 120. Field device database 120 may be able to hold any number of pieces of data pertaining to field devices. Data in field device database 120 may be organized into sections. Each section may represent a different type of device, such as an actuator. The sections may then be further broken down into subsections. Continuing with an actuator as an example, the section with information about actuators can have further sections with specific types of actuators and/or specific models of actuators. Field device database 120 may be able to include any sort of data about the devices, including, but not limited to, different wiring configurations, information about a motor in the device, information about the general specifications of the device, information concerning how a piece of building equipment works and its benefits, information on how the piece of building equipment is operated, information about how to assemble the device, information about warnings associated with the device, or any other pieces of information associated with the building equipment In some embodiments, field device database 120 is divided into a plurality of sections including, but not limited to, data associated with actuators, cameras, meters, sensors, smoke detectors, and any other building equipment that controllers may be wired to. Examples of different types of actuators include, but are not limited to, proportional, incremental, and two position. Examples of different types of sensors include, but are not limited to, temperature, humidity, status, and CO2. Information in field device database 120 may be dynamic, so sections can be added, section may be removed, information may be added, and information may be removed.

Data concerning each piece of building equipment may also be removed if, for example, a user determines the data is obsolete, incorrect, or no longer useful. The data may be removed for any reason. To remove the data, a user could attach a machine to network 115 and access field device database 120. Once the user accesses field device database 120, the user may be able to remove the data through the machine. Another method of removing data from field device database 120 may be setting up an automatic removal system, where all data that has been in field device database for X years is automatically removed. X may be any number of years, including a portion of a year. There are no limitations to the amount of data field device database 120 may be able to hold or remove.

Field device provider 104 and controller provider 102 may be the same entity. The entity may upload data to network 115 at the same time the entity uploads wiring diagrams 115 or it may upload them separately.

Referring still to FIG. 1, user devices 106, 108, and 110 are shown. User devices 106, 108, and 110 may be electronic devices wherein users may be able to receive data and information from network 115. User devices 106, 108, and 110 may be able to send requests across network 115 to installation management system 114 asking for data and wiring diagrams about individual components. After sending the request, user devices 106, 108, and 110 receive a graphical user interface from user interface generator 112 in installation management system 114 with the information in a display for the user. Examples of user devices include, but are not limited to, mobile phones, electronic tablets, laptops, desktop computers, televisions, cameras, meters, sensors, smoke detectors, and any other electronic device that may be able to attach to a network. User devices 106, 108, and 110 may display data and information. User devices 106, 108, and 110 may receive and show data related to controller information sent to network 115 by controller provider 102 and data sent to network 115 by field device provider 104. According to the disclosure, user devices 106, 108, and 110 may be used by installers using controller information sent by controller provider 102 and/or data sent from field device provider 104 to install field devices, as described below. However, any type of entity may use user devices 106, 108, and 110 and the controller information and data sent to user devices 106, 108, and 110. There may be any number of user devices 106, 108, and 110 attached to network 115.

As will be described below, once the data and wiring diagrams are sent to user devices 106, 108, and 110, the data and controller information may be displayed to a screen on each user device 106, 108, and 110. The data and controller information may be shown adjacent to each other at one moment in time or separately.

In some embodiments, installation management system 114 is a system that receives, stores, and manipulates the data and wiring diagrams that controller provider 102 and field device provider 104 send to network 115. Installation management system 114 may also generate a graphical user interface and send the graphical user interface to user devices 106, 108, and 110. Installation management system 114 may include any number of components for receiving, storing, and manipulating data and for generating a graphical user interface. Installation management system 114 may send the graphical user interface to user devices 106, 108, and 110 via network 115. Installation management system 114 may include a user interface generator 112, a wiring diagram generator 116, a serving system 118, a field device database 120, and a controller database 122. Each component 112, 116, 118, and 120 may be connected. Installation management system 114 may be connected to network 115 through serving system 118.

Serving system 118 may be configured to receive requests from user devices 106, 108, and 110, transmit the requests to wiring diagram generator 116, and send responses received from user interface generator 112 to user devices 106, 108, and 110. For example, serving system 118 can receive a request from a user device asking for a wiring diagram showing a controller wired to a field device. Serving system 118 can send the request to wiring diagram generator 116 and receive a user interface from user interface generator 112. After receiving the user interface from user interface generator 112, serving system 118 may determine if the user interface includes everything the requests asks for. To do so, serving system 118 may compare the request with the contents of the user interface. If the user interface includes everything requested in the request, serving system may send the user interface to network 115. If the user interface does not include everything, serving system 118 may send another request to wiring diagram generator 116 with instructions to include more data from field device database 120 or data from controller database 122. In this scenario, wiring diagram generator 116 may retrieve the extra data or wiring diagrams and send a new graphical wiring diagram to user interface generator 112. User interface generator 112 may create a new graphical user interface and send it to serving system 118. Once serving system 118 verifies that everything asked for in the request has been included in the user interface, serving system 118 may send the user interface to network 115.

Serving system 118 can also be configured to receive and deposit controller diagrams and field device wiring diagrams along with associated data from controller provider 102 and field device provider 104. After receiving the wiring diagrams and data, serving system 118 can configure the wiring diagrams and data into a standardized form and deposit them into databases 120 and 122.

Wiring diagram generator 116 may be configured to automatically generate graphical wiring diagrams and information associated with the wiring diagrams and send them to user interface generator 112. Wiring diagram generator 116 may include any number of components and is not limited to what is described here. Wiring diagram generator 116 may receive a request from a user device 106, 108 or 110 through serving system 118 requesting a graphical wiring diagram showing how to wire a controller to a field device. The request may include an identifier representing pieces of building equipment, such as a controller and a field device. In some embodiments, the request could identify two controllers or two field devices. Wiring diagram generator 116 may generate a wiring configuration list after determining the different wiring configurations that are compatible with both the controller and the field device. Wiring diagram generator 116 may then automatically select a wiring configuration from the wiring generation list. In some embodiments, wiring diagram generator 116 may automatically select the wiring configuration after receiving a request from a user identifying a desired mode of operation and selecting the wiring configuration that allows the pieces of building equipment to operate in that mode. After selecting the wiring configuration, wiring diagram generator 116 may use the selection to create a graphical wiring diagram and send the graphical wiring diagram to user interface generator 112.

User interface generator 112 can be configured to receive the graphical wiring diagram from wiring diagram generator 116 and generate a graphical user interface that shows how to wire two pieces of building equipment together. The graphical user interface may include device-specific wiring diagrams for connecting the two pieces of building equipment specified by the request to serving system 118. The graphical user interface may also contain information describing how to wire the requested pieces of building equipment and may include different wiring variations that each produce different modes of operation of the field device and/or controller. After generating the graphical user interface, user interface generator 112 may send the graphical user interface to user devices 106, 108, and 110 through serving system 118 and network 115.

Network 115 may include any element or system that enables communication between field devices and systems. Network 115 may enable communication between controller provider 102, field device provider 104, user devices 106, 108, and 110, user interface generator 112, and installation management system 114 and its components therein. Network 115 may connect the components through different telecommunications networks, such as the Internet, Wi-Fi, telephone, Lan-connections, or any other network that allows devices to communicate with each other. In some instances, network 115 may include servers or processors that facilitate communications between the components of installation environment 100.

Figure 2:
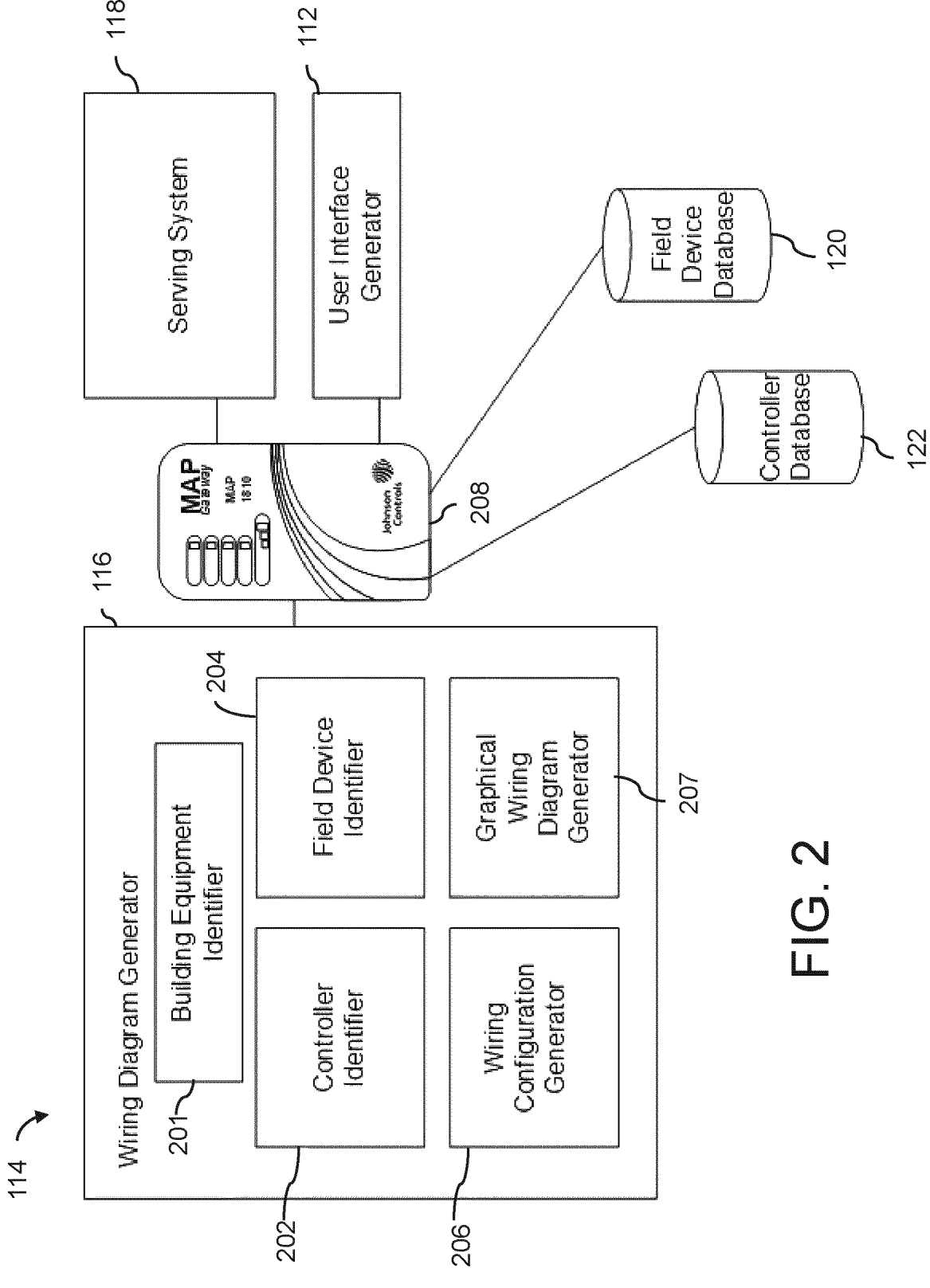
FIG. 2 is a block diagram of an installation management system 114 used to generate user interactive graphical user interfaces displaying wiring diagrams between two pieces of building equipment

Referring now to FIG. 2, a block diagram of an installation management system 114 used to generate user interactive graphical user interfaces displaying wiring diagrams between two pieces of building equipment. System 114 is shown to include many of the same components described with reference to FIG. 1. For example, system 114 is shown to include a user interface generator 112, a wiring diagram generator 116, a serving system 118, a field device database 120, and a controller database 122. System 114 may also include a wireless gateway 208, which may be connected to user interface generator 112, wiring diagram generator 116, serving system 118, and databases 120 and 122. Installation management system 200 may include additional, fewer, or different components depending on the particular embodiment. Wireless gateway 208 may be connected to user interface generator 112, wiring diagram generator 116, serving system 118, field device database 120, and controller database 122 through a network (not shown).

Serving system 118 may be able to send and receive data and information from the network or other components within installation management system 114. Serving system 118 may be able to receive controller information from controller providers 102 and distribute the controller information to controller database 122. Serving system 118 may also be able to receive the data associated with a field device from field device providers and distribute the field device data to field device database 120. In some embodiments, serving system 118 may also receive user interfaces from user interface generator 112. Once serving system 118 receives a user interface, serving system 118 may be able to transmit the user interface to a user device (not shown). Further, serving device 118 may receive a request for data from the user device. After receiving the request, the serving system may transmit the request to user interface generator 112.

Wiring diagram generator 116 is shown to include a building equipment locator 201, a controller identifier 202, a field device wiring identifier 204, and a wiring configuration generator 206. Each component in wiring diagram generator 116 may be connected to each other and to wireless gateway 208. Components 201, 202, 204, and 206 can be configured to receive a request from a user device asking for a wiring diagram between a controller and a field device, identify the controller and field device in one or a plurality of databases, and determine which wiring configuration will wire the controller to the field device. The following paragraphs describe some of the general functions performed by each component 201, 202, 204, and 206 in wiring diagram generator 116.

Building equipment locator 201 may be a component within wiring diagram generator 116 configured to identify the pieces of building equipment a user wants to wire together based on information in a request within controller database 122 and field device database 120. For example, once a user sends a request to wiring diagram generator 116 asking for a wiring configuration between a controller and a field device, building equipment locator 201 can identify the controller and the field device in the controller database and the field device database. Building equipment locator 201 can do this by matching a an RFID code, a UPC code, a CPC binary bar code, a POSTNET, a QR code, or other type of device-identifying information with a particular type of device (e.g., a particular model) using the information in the controller database and field device database. Consequently, the two "wiring identifier" components (controller identifier 202 and field device identifier 204) may know which wiring configurations to retrieve.

Controller identifier 202 may be a component within wiring diagram generator 116 configured to identify all of the possible wiring configurations that the identified controller is capable of using. Controller identifier 202 may be capable of using controller information in controller database 122 to identify all possible wiring configurations that the controller could possibly use. For example, if a request comes in asking how to wire a certain controller with a certain field device, controller identifier 202 can retrieve information from controller database 122 pertaining to the controller that building equipment locator 201 identified. Controller identifier 202 can sort through all of the information related to the controller and determine each possible wiring configuration the controller has. Controller identifier 202 can send each possible wiring configuration to wiring configuration generator 206 along with data associated with each wiring configuration indicating how the controller operates under each wiring configuration.

Field device identifier 204 may be a component within wiring diagram generator 116 configured to identify all of the possible wiring configurations that the identified field device is capable of using. Controller identifier 202 may be capable of using field device information in field device database 120 to identify possible wiring configurations that the field provider could possibly use. Similar to controller identifier 202, field device identifier may be capable of using field device information in field device database 120 to identify all possible wiring configurations that the field device could possibly use. Using the example above, field device identifier 204 can retrieve information from field device database 120 pertaining to the field device that building equipment locator 201 identified. Field device identifier 204 can sort through all of the information related to the field device and determine each possible wiring configuration the field device has. Field device identifier 204 can send each possible wiring configuration for the field device to wiring configuration generator 206 along with data associated with the field device indicating how the field device operates under each wiring configuration.

Wiring configuration generator 206 may be a component within wiring diagram generator 116 configured to receive all of the possible wiring configurations from controller identifier 202 and field device identifier 204. Wiring configuration generator 206 may also determine which wiring configurations are compatible with each other. Wiring configuration generator 206 may generate a list including each possible wiring configuration that could be used to connect the identified controller to the identified field device. Wiring configuration generator 206 may generate this list by comparing the wiring configurations of the controller with the wiring configurations of the field device and identifying wiring configurations in the controller and the field device that are compatible with each other. In some embodiments, each matched wiring configuration corresponds to a different mode of operation for at least one of the controller and the field device. For example, a request may be sent to wiring generator 206 from a user device asking for a wiring diagram describing how to wire an actuator to a controller. Wiring configuration generator 206 can receive all the possible wiring configurations of the controller and the actuator from controller identifier 202 and field device identifier 204 respectively and generate a list of wiring configurations that can successfully wire the actuator to the controller. After creating the list, wiring configuration generator 206 can send the list to graphical wiring diagram generator 207.

In some embodiments, wiring configuration generator 206 can identify a wiring configuration between a specific controller and a specific field device that causes the controller and field device to operate in a specific manner. For example, if a user sends a request to wiring configuration generator 206 asking how to wire a controller to an actuator so the actuator rotates clockwise, wiring configuration generator 206 can identify and generate a wiring configuration that will cause the actuator to do so. Wiring configuration generator 206 may tailor the wiring configurations it generates to any sort of requested mode of operation (e.g., low power, high power, clockwise, counterclockwise, pulse, continuous, etc.).

Graphical wiring diagram generator 207 may be a component within wiring diagram generator 116 configured to create a graphical wiring diagram. The generated graphical wiring diagram may illustrate wiring configurations that allow both a controller and a field device to operate properly when they are wired together. The graphical wiring diagram may display any sort of information (e.g., descriptions of the controller, descriptions of the field device, possible wiring configurations between the two pieces of building equipment, warnings about the pieces of building equipment, etc.) The graphical wiring diagram may display wiring configurations in multiple ways (e.g., 3 dimensional view, view from the top, the wiring configurations of the controller and the field device side by side, verbal instructions, etc.). In some embodiments, graphical wiring diagram generator 207 can generate a graphical wiring diagram including one or a plurality of wiring configurations for a single controller or field device. If graphical wiring diagram generator 207 determines that it needs more information to create the graphical wiring diagram, it can send a request back to components 201, 202, 204, and 206 asking for the information and generate a graphical wiring diagram based on this information. Once graphical wiring diagram generator 207 generates the graphical wiring diagram, graphical wiring diagram generator 207 can send the graphical wiring diagram to user interface generator 112.

In some embodiments, graphical wiring diagram generator 207 can receive requests from a user device through serving system 118 and request information from components 201, 202, 204, 206 to respond to the request from the user device. The request may be for different ways to wire the controller with the field devices, or it may be for a wiring configuration so the field device may operate in a specific manner. Graphical wiring diagram generator 207 may receive the request when a user wants to view a different wiring configuration than what was initially presented to the user. In this scenario, graphical wiring diagram generator 207 can receive the request and update the graphical wiring diagram with the new information it receives from components 202, 202, 204, and 206.

Wireless gateway 208 may connect user interface generator 112, serving system 118, field device database 120, and controller database 122 to the network and the components that are also attached to the network. Wireless gateway 208 may communicate with each processor that is internal or external to the network using NFC, Bluetooth, WiFi direct, cables, etc., or via a communication network such as a BACnet network, a LonWorks network, a LAN, a WAN, the Internet, a cellular network, etc. using wired or wireless electronic data communications.

User interface generator 112 may be configured to retrieve a graphical wiring diagram from graphical wiring diagram generator 207 and generate a graphical user interface. User interface generator 112 may be one or a plurality of components that are used to receive, configure, and distribute graphical user interfaces. After retrieving or receiving a graphical wiring diagram from wiring diagram generator 116, user interface generator 112 may be able to manipulate the graphical wiring diagram to create a user-interactive graphical user interface showing how to wire a controller to a field device. User interface generator 112 may then be able to send the user an interactive graphical user interface including data associated with the controller and field device that are wired together in the graphical wiring diagram.

An example graphical user interface generated by user interface generator 112 is a picture of an actuator with inputs in the actuator colored differently from the rest of the actuator. The graphical user interface may include a wiring diagram represented by wires going into the inputs in a configuration and a description of the mode of operation for the displayed wiring configuration. In some embodiments, the graphical user interface is user-interactive, so a user may be able to press on different parts of the data or wiring diagrams to receive a different display. For example, if the graphical user interface is showing an actuator wired so the rotor turns clockwise, the user may be able to press on the display and change the wiring to see how a change in wiring affects how the actuator operates. After changing the wiring in the graphical user interface, text may accompany the change telling the user the effect of the change. If a user asks for information that is not included in the user interface, wiring diagram generator 116 may send a new graphical wiring diagram to user interface generator 112 with the requested data. User interface generator 112 may then create and send a new graphical user interface to the user device that requested the new information. Once user interface generator 112 receives the information, user interface generator 112 may send the information to the user device to display the information through the graphical user interface.

In some embodiments, the graphical user interface is configured to send a request to components 201, 202, 204, 206, 207, and 112 after the user device sends a request to serving system 118 for a different wiring configuration between a controller and a field device or for more information about a controller or field device. Components 201, 202, 204, 206, 207, and 112 may retrieve the requested data, send a graphical wiring diagram to user interface generator 112, and user interface generator 112 can generate a new interactive user interface to send to the user device.

In some embodiments, the information that user interface generator 112 sends to the user device along with the graphical user interface already includes all possible connotations of requests from the user. Each configuration is stored on the user device. Consequently, the graphical user interface can generate a new display showing newly requested information by retrieving the new information from the user device. User interface generator 112 may send any number of wiring diagrams or data to a user device with a user interface, regardless of the request from the user device.

In some embodiments, a user device may request a wiring configuration between two controllers or two field devices. To do so, a user at a user device may input the product codes for two controllers or two field devices instead of a controller and a field device.

In some embodiments, serving system 118 can tag information associated with pieces of building equipment, such as controllers and field devices, with tags describing what type of controller and/or field device they are, how they operate, and the different wiring configurations they have. In some embodiments, the entity uploading a diagram for a piece of building can manually tag the relevant equipment and wiring diagram. In some embodiments, serving system 118 can automatically tag the diagram with the building equipment's type by analyzing the information on the diagram and determining which type of building equipment the information is describing by comparing the information to information in a database (not shown) full of building equipment types. If serving system 118 can find a match by finding enough similarities between the uploaded information and the information in the database to meet a user selected threshold, serving system 118 can tag the information indicating which piece of building equipment the information is describing.

Wiring configurations can be tagged with an identifier representing which controller or field device the wiring configuration can work with along with the controller or field device's type. Once the wiring configurations are tagged, they can be stored in either database 120 or 122. A wiring configuration can have multiple tags, each tag representing a different type of field device or controller that can operate with the wiring configuration. Further, each wiring configuration can have a tag of its own describing what type of wiring configuration it is and how it is meant to operate. An example is a wiring configuration may be intended to cause an actuator to operate clockwise instead of counter clockwise, or at a variable speed instead of a fixed speed. After tagging the devices and wiring configurations, serving system 118 can store the information about the devices in controller database 122 and field device database 120. Upon receiving a request from a user device, wiring diagram generator 207 can receive these tags associated with the controllers and field devices and generate wiring diagrams by matching similarly tagged wiring configurations of the requested building equipment. In some embodiments, wiring diagram generator 207 can automatically generate the wiring diagrams by selecting a wiring diagram that has been tagged with identifiers for the requested building equipment.

Figure 3:
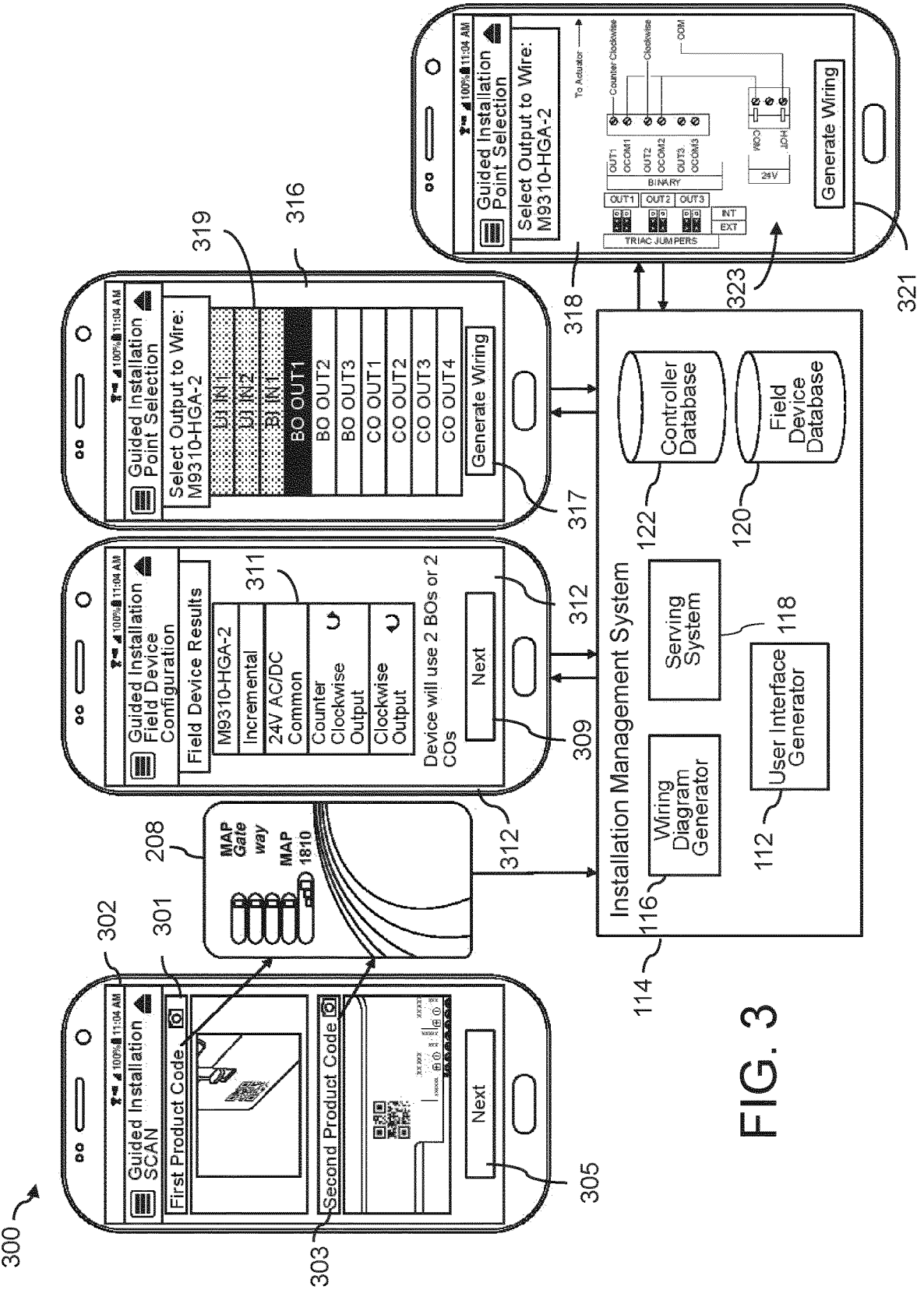
FIG. 3 is a block diagram of an installation management system that can receive requests for wiring diagrams from a user device, generate the wiring diagrams, and display the wiring diagrams via the user device, according to some embodiments.

Referring now to FIG. 3, a block diagram of an installation management system that can receive requests for wiring diagrams from a user device, generate the wiring diagrams, and display the wiring diagrams via the user device is shown, according to some embodiments. The components of system 300 may be similar to the components of installation environment 100, described in reference to FIG. 1, and the components of system 200, described in reference to FIG. 2. System 300 may include additional, fewer, or different components depending on the particular embodiment. System 300 may include an interface 302 displayed on a user device, wireless gateway 208, controller database 122, field device database 120, user interface generator 112, an interface 312, an interface 316, and an interface 318. After an input from a user and through the user device, interface 302 may send wiring diagram generator 116 requests to installation management system 114 including product codes for controllers, field devices, or a combination of a controller and a field device. After receiving a response to the request, interface 302 may transition to interface 312. Interface 312 may send a request to wiring diagram generator 116. In response, user interface generator 112 may send a user device a graphical user interface to be displayed as an output represented by interface 316 or interface 318.

Interface 302 may be a graphical user interface that is shown on a user device. Interface 302 may be shown on any type of user device such as, but not limited to, personal computers (e.g., desktop computers), mobile computing devices, cell phones, smart phones, head-mounted computing devices, media players/recorders, music players, game consoles, media centers, media players, electronic tablets, personal digital assistants (PDAs), television systems, audio systems, radio systems, removable storage devices, navigation systems, set top boxes, and other electronic devices. Interface 302 may include a request 301 asking for a user to input a first product code, a request 303 asking the user to input a second product code, and a next button 305 which brings the user to a different display on the graphical user interface. The interface may be directed to allowing a user to input two different pieces of building equipment, such as, but not limited to, a controller and a field device, two controllers, or two field devices. The user may be able to input both product codes and then press the next button to obtain options for how the user wants the graphical user interface to display the results.

Request 301 may be a request for the user to input a product code for a type of piece of building equipment the user wants information about. Request 301 may be asking for data associated with a device, data associated with controller information, data associated with a controller, or data associated with any other type of building equipment. The user may respond to request 301 by manually typing out the name of the piece of building equipment or by typing out a code associated with the piece of building equipment. Other methods of inputting a product code include scanning an RFID code, scanning a bar code, scanning a QR code, infrared tags, ultrasound tags, video, and other forms of visual ID. Once the user inputs the product code, the graphical user interface may receive the input and acknowledge that the product code was correctly received. In some embodiments, the user device may send a request to wiring diagram generator 116 asking if data associated with the scanned piece of building equipment is in either controller database 122 or in field device database 120. If the scanned product is in one of the databases, wiring diagram generator 116 may send a message to the user device which may then display a message or picture on the graphical user interface saying the device was found. If the piece of building equipment was not found in either database, then the graphical user interface may display a message stating the device was not found. If the product code was not correctly identified, whether because the code was incorrect, the reading was inaccurate, or for any other reason, the graphical user interface may display an error message showing that the product code was not correctly received.

Request 303 may be a request from the user that is similar to request 301. A user may be able to input a product code and receive a notification of whether the input was successful or if the user should try again.

Next button 305 may be a button on the graphical user interface that brings a user to another display after two product codes have been correctly scanned and wiring diagram generator 116 has determined two products associated with the product codes are in at least one of databases 120 and 122. Once both product codes have been successfully scanned, the user can press next button 305 to get to the next user interface. In some embodiments, a user may press next button 305 after only inputting one product code. In these embodiments, the user may be looking for data pertaining to just one piece of building equipment and the graphical user interface may be able to accommodate this request. Once next button 305 is pressed, a request may be sent through wireless gateway 208 to wiring diagram generator 116 or user interface generator 112 asking for data regarding two pieces of building equipment and a graphical user interface that may be able to show the pieces of building equipment together. In an example embodiment, a user may scan an RFID code for a field device and an RFID code for a controller, asking how to wire the two together. After scanning the piece of building equipment, the user may press next button 305 and a request may be sent through wireless gateway 208 to the serving system 118 which may relay the request to wiring diagram generator 116. The request may ask for information and a graphical user interface displaying the field devices wired to the controller.

Interface 312 may be a graphical user interface designed to ask a user which mode of operation the user would like to receive a wiring instructions on. Interface 312 may include table 311 and next button 309. Table 311 may be directed to the different options for modes of operation of a field device and a display of what type of field device it is. For example, table 311 may include an actuator with the product name M9310-HGA-2, as shown in FIG. 3, and options for how the actuator can run. In this example, the actuator may be able to operate in an incremental mode at 24V AC/DC Common and can either turn counter clockwise or clockwise. The user may be able to choose between running the actuator clockwise and counter clockwise. In other examples, the actuator may be able to operate in different modes and at different voltage levels. Further, the actuator may use a DC voltage source. Interface 312 may also include more information about the field device, such as "Device will use 2 BOs or 2 COs." The information that is displayed may differ depending on the field device that is being wired to a controller. Once the user chooses an option, the user may press next button 309 to send a request to user wiring diagram generator 116 for information associated with the field devices, like a wiring diagram. User interface generator 112 may receive the information requested at the user device and send it back to the user device.

Interface 316 may show the different inputs and outputs that the field device has in a list form 319 and give the user an opportunity to pick which outputs and inputs to use when wiring a controller to a field device. The outputs and inputs that the user selects may be displayed in a graphical user interface displaying the controller connected to the field device. Once the user selects the inputs and outputs, the user may be able to select a generate wiring button 317 to show the user how to wire the controller to the field device. Once generate wiring button 317 is pressed, the user device may send another request to wiring diagram generator 112 asking for wiring and data information that correspond to the user selected inputs. Wiring diagram generator 116 may retrieve this information and send back a graphical user interface through user interface generator 112 showing the requested information.

Interface 318 is another embodiment of a display giving a user the option of determining how the user wants to wire a field device to a controller to achieve a certain mode of operation. Interface 318 may include a graphic 323 with a picture showing the different wiring configuration types instead of a table as shown in interface 316. In this embodiment, the user may select how the user wants the field device to operate by pressing on one of the wiring options, such as counter clockwise or clockwise. Once the user has selected a mode of operation, the user may receive a graphical user interface showing the user how to wire the field devices to the controller by pressing on a generate wiring button 321. Once generate wiring button 321 is pressed, the user device may send another request to wiring diagram generator 112 asking for wiring and data information that correspond to the user selected inputs. Wiring diagram generator 116 may retrieve this information and send back a graphical user interface through user interface generator 112 showing the requested information.

Figure 4:
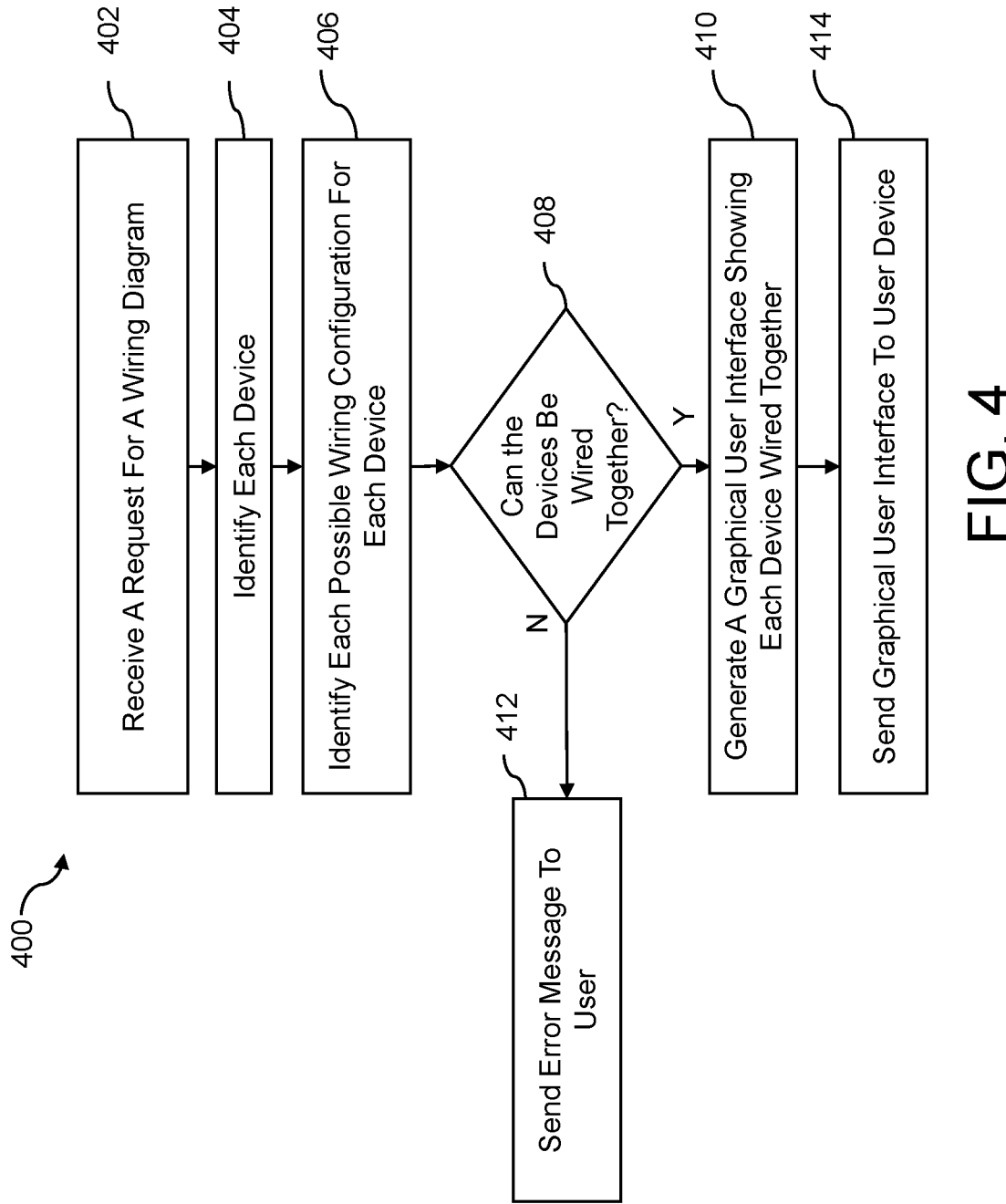
FIG. 4 is flowchart of a process for uploading wiring diagrams and equipment data pertaining to building equipment to an installation management system and sending and displaying them on a user device, according to some embodiments.

FIG. 4 is a flowchart of a process 400 for uploading wiring diagrams and equipment data pertaining to building equipment to an installation management system and sending and displaying them on a user device, according to some embodiments. Process 400 may include more or fewer operations than are described here, this disclosure is not meant to be limiting. Process 400 may be conducted using components shown and discussed in reference to FIGS. 1-3. Process 400 includes operations 402, 404, 406, 408, 410, 412, 414. Each operation is directed towards receiving a request for a graphical wiring diagram between two pieces of building equipment, such as a controller and a field device; determining a wiring configuration for the two pieces of building equipment, generating a graphical user interface; and sending the graphical user interface to the user device that sent the request.

In operation 402, the installation management system may receive a request from a user device asking for a wiring diagram between two pieces of building equipment. The request may also ask for other information pertaining to each piece of building equipment. In operation 404, the building equipment locater identifies each piece of building equipment in the databases. If one or both of the pieces of building equipment are not in either database, the installation management system may send a message to the requesting user device stating that the piece of building equipment is not in the system.

In operation 406, a controller identifier and a field device identifier may identify each possible wiring configuration for the pieces of building equipment in the request. In operation 408, a wiring configuration generator may match compatible wiring configurations between the pieces of building equipment and may create a list including each matched wiring configuration with information associated with each match. The information may pertain to the physical components of the pieces of building equipment, the wiring configurations, how each piece of building equipment may operate under each wiring configuration, etc. In operation 410, if the wiring configuration generator does not find a matching wiring diagram between the two pieces of building equipment, the installation management system sends an error message back to the user device indicating that the pieces of building equipment cannot be wired together.

In operation 412, if the wiring configuration generator finds at least one match, the graphical wiring diagram generator may generate a graphical wiring diagram displaying the two pieces of building equipment wired together. The graphical wiring diagram may include other information related to the pieces of building equipment or the wiring configuration. In operation 414, the user interface generator may generate a user-interactive user interface. The user-interactive graphical user interface may allow a user to obtain further information about each piece of building equipment and the wiring diagram by pressing on spots within the graphical user interface. In some embodiments, the graphical user interface includes all the information about each piece of building equipment and each wiring configuration when it is initially sent to the user device. In these embodiments, the user interface can retrieve information from the user device. In some embodiments, only the initially selected wiring configuration and building equipment information is sent to the user device, so the user device can send another request to the installation management system to obtain a new graphical user interface.

In some embodiments, process 400 includes an operation (not shown) where a controller provider uploads controller information, such as a wiring diagram, to a network. When uploading the controller diagram, the controller provider may manually tag the wiring diagram with tags describing the controller and different wiring configurations for the controller. The process may also include an operation where a field device provider uploads a wiring diagram for a field device along with information about the field device, and tags the wiring diagram and information with similar tags. When the wiring configurator matches the requested controller with the requested field device, the wiring configurator can match the tags of the wiring configurations for each piece of building equipment. If the controller has a wiring configuration with a same tag as the field device, the wiring configuration generator may add the wiring configurations to a list and send the list to the graphical wiring diagram generator.

Figure 5:
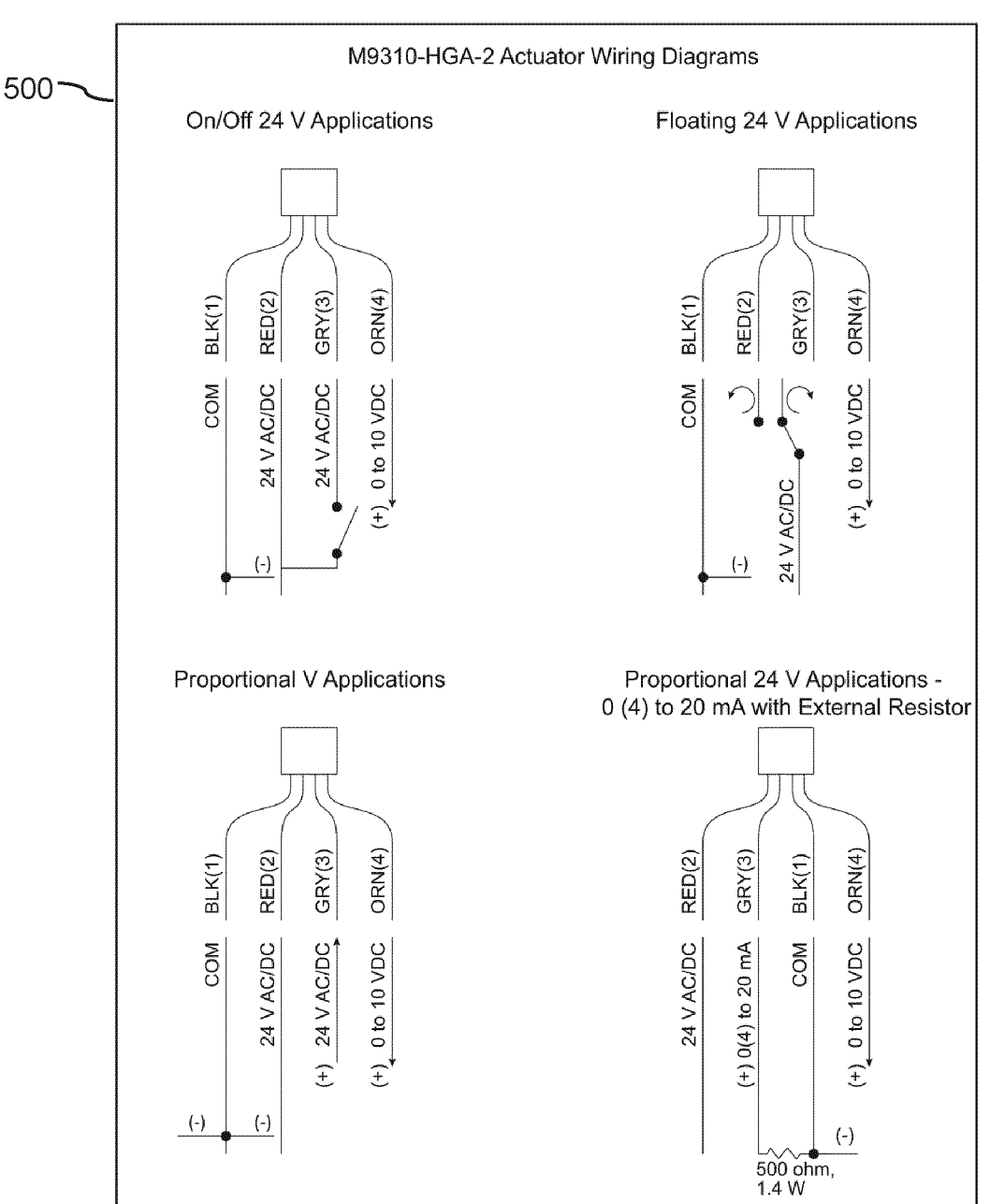
FIG. 5 is a wiring diagram illustrating various wiring configurations for an actuator, according to some embodiments.

FIG. 5 shows a wiring diagram 500 illustrating various wiring configurations for an actuator, according to some embodiments. Wiring diagram 500 is shown to include different wiring configurations which may result in the actuator operating differently depending on the wiring configuration. The different wiring configurations shown in the data set configure the actuator to operate in On/Off 24 V Applications, Floating 24 V Applications, Proportional V Applications, and Proportional 24 V Applications—0 (4) to 20 mA with external resistor. This particular example is directed to an M9310-HGA-2 Actuator. When uploaded to a serving system, the serving system can store all of the pictures, the type of device, and the different wiring configurations in the field device database. In some embodiments, wiring diagrams may be able to include any amount of information including any type of information about any type of field device or controller.

Figure 6:
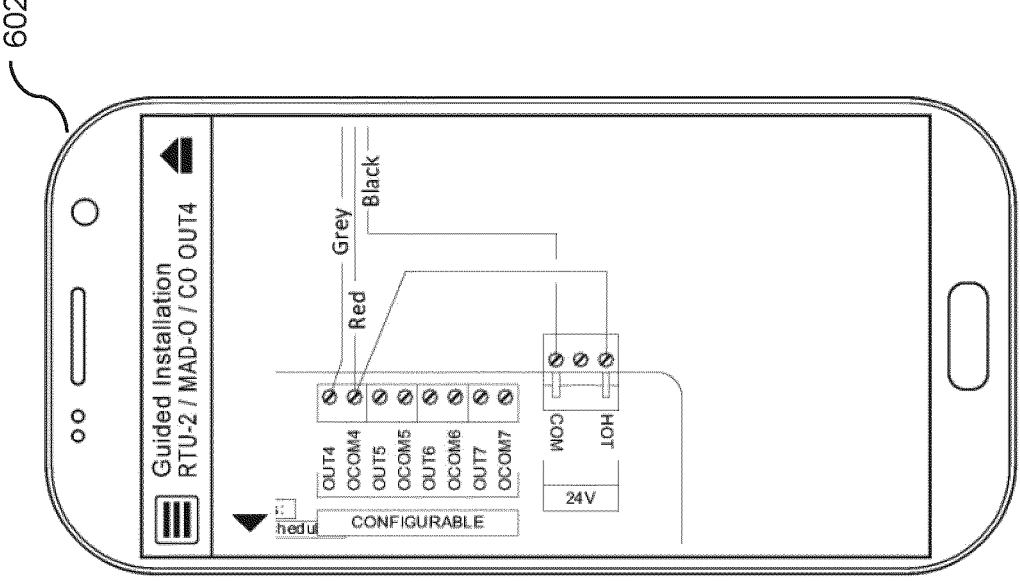
FIG. 6 is an illustration of a user device with a graphical user interface generated by the installation management system of FIGS. 2-4 including wiring and configuration instructions for building equipment, according to some embodiments.
Figure 6:
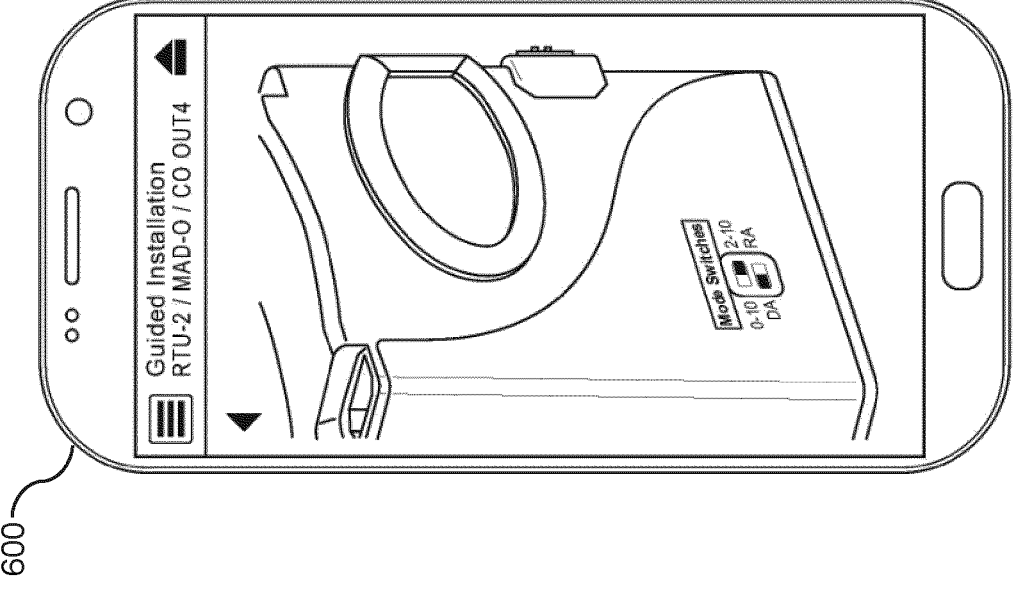

FIG. 6 shows illustrations 600 and 602 of a user device with graphical user interfaces generated by installation management system (not shown) of FIGS. 2-4 including wiring and configuration instructions for building equipment, according to some embodiments. Illustration 600 shows a picture of an example field device. Illustration 602 shows an example graphical user interface of a wiring diagram associated with a field device.

Figure 7:
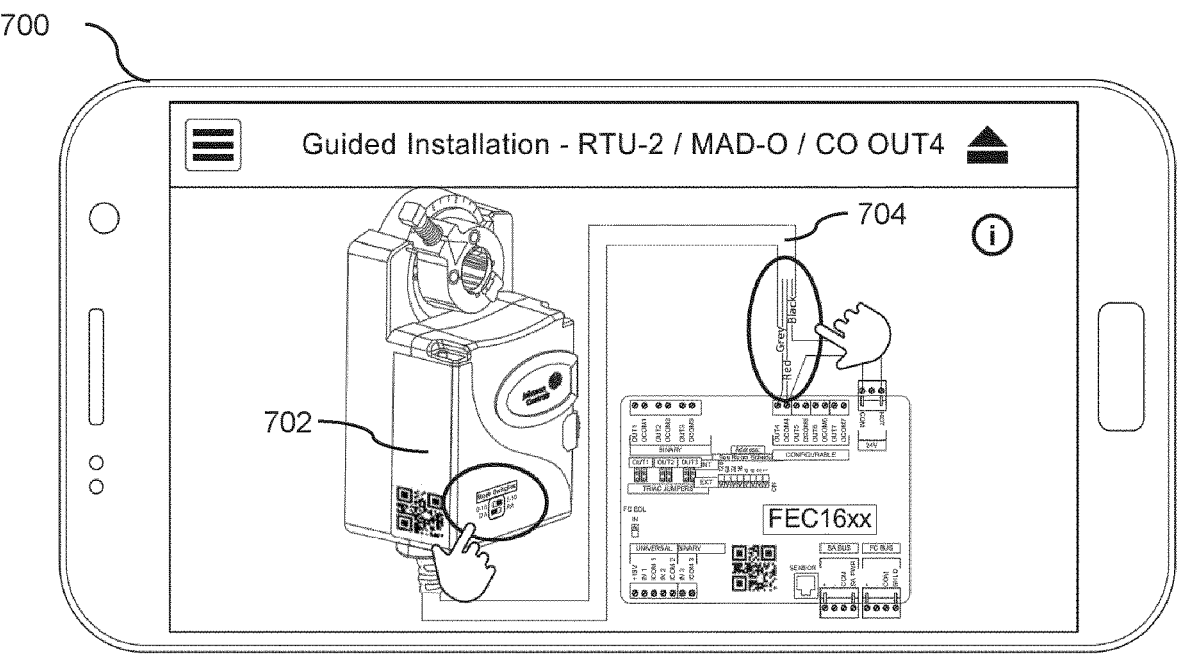
FIG. 7 is another illustration of a user device with a graphical user interface generated by the installation management system of FIGS. 2-4 including wiring and configuration instructions for building equipment, according to some embodiments.

FIG. 7 is another illustration 700 of a user device with a graphical user interface generated by installation management system (not shown) of FIGS. 2-4 including wiring and configuration instructions for building equipment, according to some embodiments. The illustration shows a controller wired to a field device with pointers 702 and 704 pointing to the wiring configuration where the controller is wired to the field device.

Figure 8:
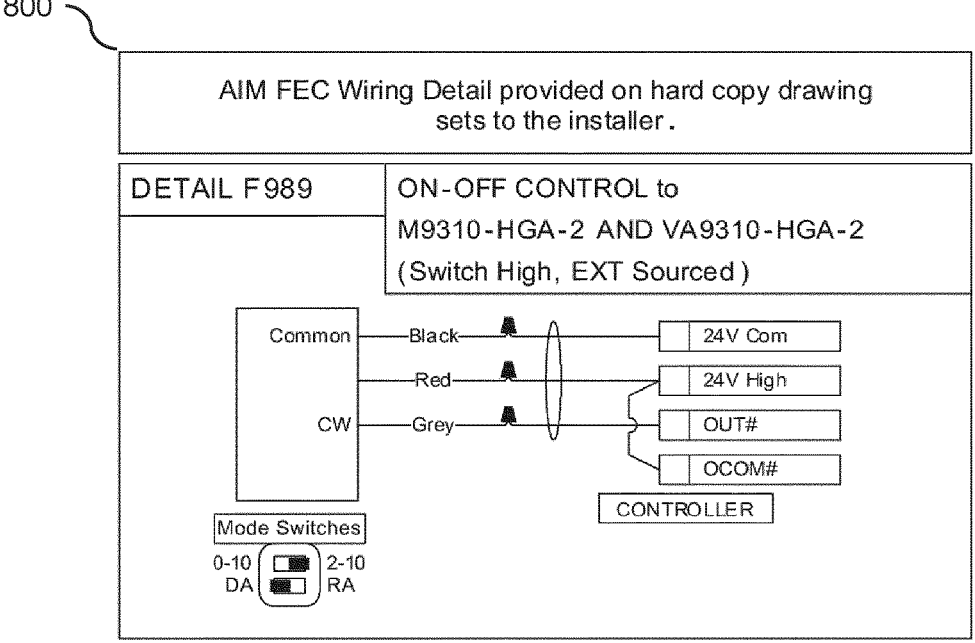
FIG. 8 is an illustration of a wiring diagram of a controller connected to a field device, according to some embodiments.

FIG. 8 is an illustration 800 of a wiring diagram of a controller connected to a field device, according to some embodiments. Illustration 800 shows a hard copy drawing of a controller connected to a field device along with details describing which wires connect the two together and to which inputs. Illustration 800 also shows a description which controller is connected to which field device and how they are connected (Switch High, EXT Sourced).

Figure 9:
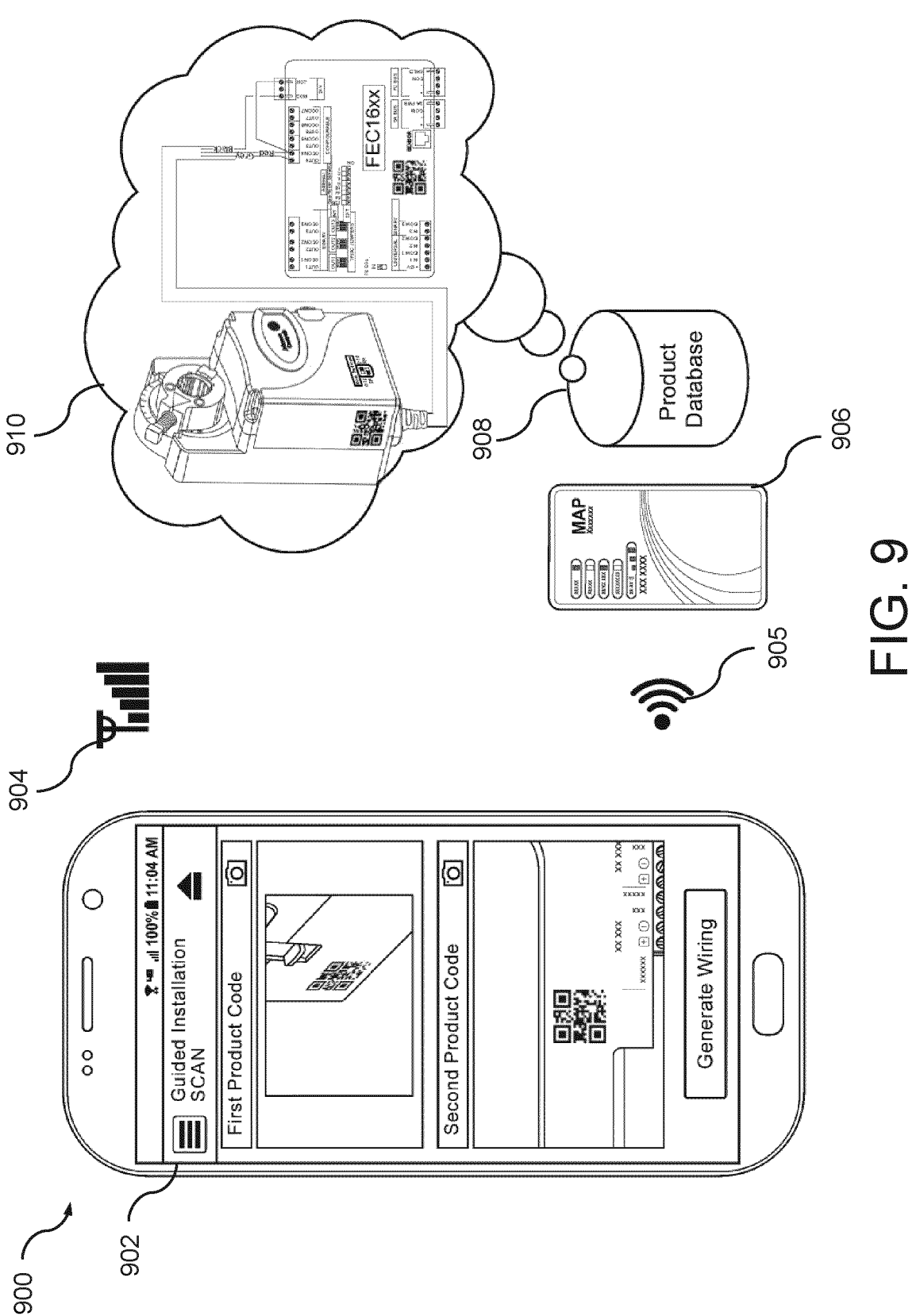
FIG. 9 is an illustration of a user device connected to a product database having a wiring configuration connecting a controller with a field device, according to some embodiments.

FIG. 9 is an illustration 900 of a user device 902 connected to a product database 908 having a wiring configuration connecting a controller with a field device, according to some embodiments. Illustration 900 shows user device 902 at an interface where a user can input two product codes to receive a wiring configuration. Illustration 900 also includes signal symbol 904 indicating the user device's 902 signal strength when contacting a wireless gateway 906. User device's 902 contact with wireless gateway 906 is illustrated with a contact symbol 905. After contacting wireless gateway 906, user device 902 can access a product database 908 holding different wiring configurations. An example wiring configuration between a controller and a field device is shown in wiring configuration 910.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media may be able to be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method for guided installation of building equipment, the method comprising:

receiving, by one or more processors from a user device, an indication of a first piece of building equipment and a second piece of building equipment;

identifying, by the one or more processors, one or more first wiring configurations associated with the first piece of building equipment, each tagged with an identification of a different type of the one or more first wiring configurations, and one or more second wiring configurations associated with the second piece of building equipment, each tagged with an identification of a different type of the one or more second wiring configurations;

comparing, by the one or more processors, identifications of the types of the one or more first wiring configurations of the first piece of building equipment with the identifications of the types of the one or more second wiring configurations of the second piece of building equipment;

automatically selecting, by the one or more processors based on the comparison of the identifications of the types of the one or more first wiring configurations with the identifications of the types of the one or more second wiring configurations indicating a match between an identification of a type of a first wiring configuration of the first piece of building equipment and an identification of a type of a second wiring configuration of the second piece of building equipment, an equipment-specific wiring configuration for wiring the first piece of building equipment to the second piece of building equipment; and providing a graphical user interface to the user device, the graphical user interface comprising a wiring diagram illustrating the equipment-specific wiring configuration, wherein the equipment-specific wiring configuration indicates voltage at a terminal.

2. The method of claim 1, wherein the first piece of building equipment is a controller and the second piece of building equipment is a field device.

3. The method of claim 1, further comprising obtaining a first equipment identifier from the first piece of building equipment and obtaining a second equipment identifier from the second piece of building equipment, the first and second equipment identifiers comprising at least one of an RFID code, a UPC code, a CPC binary bar code, a POSTNET, or a QR code.

4. The method of claim 1, further comprising receiving a request from the user device for a new wiring configuration associated with the first and second pieces of building equipment based on an input from a user and configuring a new graphical user interface based on the new wiring configuration.

5. The method of claim 1, wherein the graphical user interface shows wire colors for the equipment-specific wiring configuration.

6. The method of claim 1, further comprising tagging each of the one or more first wiring configurations with an identifier of the first piece of building equipment and tagging each of the one or more second wiring configurations with an identifier of the second piece of building equipment.

7. The method of claim 1, wherein the equipment-specific wiring configuration is identified from a database comprising controller diagrams and a database comprising field device data, one or more wiring configurations that have been tagged with an identifier representing the first piece of building equipment and one or more wiring configurations that have been tagged with an identifier representing the second piece of building equipment.

8. The method of claim 1, further comprising displaying via the user device, a user interface that prompts a user to select a first wiring connection on the first piece of building equipment to wire to a second wiring connection on the second piece of building equipment;

wherein automatically selecting the equipment-specific wiring configuration comprises selecting a wiring configuration in which the first wiring connection on the first piece of building equipment is wired to the second wiring connection on the second piece of building equipment.

9. The method of claim 1, wherein identifying the one or more first wiring configurations associated with the first piece of building equipment and the one or more second wiring configurations associated with the second piece of building equipment comprises:

identifying, by the one or more processors, a plurality of first wiring configurations associated with the first piece of building equipment and a plurality of second wiring configurations associated with the second piece of building equipment; and wherein comparing the identifications of the types of the one or more first wiring configurations of the first piece of building equipment with the identifications of the types of the one or more second wiring configurations of the second piece of building equipment comprises:

comparing, by the one or more processors, identifications of types of the plurality of first wiring configurations of the first piece of building equipment with identifications of types of the plurality of second wiring configurations of the second piece of building equipment.

10. The method of claim 1, wherein identifying the one or more first wiring configurations associated with the first piece of building equipment and the one or more second wiring configurations associated with the second piece of building equipment comprises:

retrieving, by the one or more processors, the one or more first wiring configurations associated with the first piece of building equipment and the one or more second wiring configurations associated with the second piece of building equipment from memory.

11. An installation management system for building equipment, said installation management system comprising one or more processors communicatively coupled to one or more memory devices, said installation management system configured to:

select, from a user device, a first piece of building equipment and a second piece of building equipment;

identify one or more first wiring configurations associated with the first piece of building equipment, each tagged with an identification of a different type of the one or more first wiring configurations, and one or more second wiring configurations associated with the second piece of building equipment, each tagged with an identification of a different type of the one or more second wiring configurations;

compare the identifications of the types of the one or more first wiring configurations of the first piece of building equipment with the identifications of the types of the one or more second wiring configurations of the second piece of building equipment;

automatically select, based on the comparison of the identifications of the types of the one or more first wiring configurations with the identifications of the types of the one or more second wiring configurations indicating a match between an identification of a type of a first wiring configuration of the first piece of building equipment and an identification of a type of a second wiring configuration of the second piece of building equipment, an equipment-specific wiring configuration for wiring the first piece of building equipment to the second piece of building equipment; and provide a graphical user interface to the user device, the graphical user interface comprising a wiring diagram illustrating the equipment-specific wiring configuration, wherein the wiring diagram identifies colors of wires.

12. The installation management system of claim 11, wherein the first piece of building equipment is a controller and the second piece of building equipment is a field device.

13. The installation management system of claim 11, wherein the wiring diagram includes terminals for a controller.

14. The installation management system of claim 11, wherein the wiring diagram comprises voltage terminals for a controller.

15. The installation management system of claim 11, wherein the wiring diagram is for a 24 VAC device.

16. A non-transitory computer-readable storage medium having computer-executable instructions embodied thereon, wherein when executed by at least one processor, the computer-executable instructions cause the at least one processor to:

receive, from a user device, a selection of a first piece of building equipment and a second piece of building equipment;

identify one or more first wiring configurations associated with the first piece of building equipment, each tagged with an identification of a different type of the one or more first wiring configurations, and one or more second wiring configurations associated with the second piece of building equipment, each tagged with an identification of a different type of the one or more second wiring configurations;

compare, responsive to the selection, the identifications of the types of the one or more first wiring configurations of the first piece of building equipment with the identifications of the types of the one or more second wiring configurations of the second piece of building equipment;

automatically select, based on the comparison of identifications of the types of the one or more first wiring configurations with the identifications of the types of the one or more second wiring configurations indicating a match between an identification of a type of a first wiring configuration of the first piece of building equipment and an identification of a type of a second wiring configuration of the second piece of building equipment, an equipment-specific wiring configuration for wiring the first piece of building equipment to the second piece of building equipment; and provide a graphical user interface to the user device, the graphical user interface comprising a wiring diagram illustrating the equipment-specific wiring configuration, wherein the wiring diagram identifies colors of wires.

17. The computer-readable storage medium of claim 16, wherein the first piece of building equipment is a controller and the second piece of building equipment is a field device.

18. The computer-readable storage medium of claim 16, wherein the first piece of building equipment is an actuator.

19. The computer-readable storage medium of claim 18, wherein the actuator includes a clockwise or counter-clockwise terminal shown on the graphical user interface.

\* \* \* \* \*